(12) United States Patent
Naganuma et al.

(10) Patent No.: US 9,919,522 B2
(45) Date of Patent: *Mar. 20, 2018

(54) MEMS DEVICE, LIQUID EJECTING HEAD, LIQUID EJECTING APPARATUS, MANUFACTURING METHOD OF MEMS DEVICE, AND MANUFACTURING METHOD OF LIQUID EJECTING HEAD

(71) Applicant: SEIKO EPSON CORPORATION, Tokyo (JP)

(72) Inventors: Yoichi Naganuma, Matsumoto (JP); Eiju Hirai, Azumino (JP); Toshiaki Hamaguchi, Fujimi-machi (JP); Motoki Takabe, Shiojiri (JP)

(73) Assignee: Seiko Epson Corporation, Tokyo (JP)

(*) Notice: Subject to any disclaimer, the term of this patent is extended or adjusted under 35 U.S.C. 154(b) by 16 days.

This patent is subject to a terminal disclaimer.

(21) Appl. No.: 15/258,041

(22) Filed: Sep. 7, 2016

(65) Prior Publication Data

US 2017/0066241 A1   Mar. 9, 2017

(30) Foreign Application Priority Data

Sep. 8, 2015   (JP) .................................. 2015-176371

(51) Int. Cl.
  *B41J 2/14* (2006.01)
  *B81C 3/00* (2006.01)
  *B41J 2/16* (2006.01)

(52) U.S. Cl.
  CPC .......... *B41J 2/14233* (2013.01); *B41J 2/161* (2013.01); *B41J 2/164* (2013.01); *B41J 2/1623* (2013.01); *B41J 2/1628* (2013.01); *B41J 2/1632* (2013.01); *B81C 3/001* (2013.01); *B41J 2002/14241* (2013.01); *B41J 2002/14362* (2013.01); *B81C 2203/032* (2013.01)

(58) Field of Classification Search
  CPC ...... B41J 2/14233; B41J 2/164; B41J 2/1632; B41J 2/1628; B41J 2/161; B41J 2/1623; B41J 2002/14362; B41J 2002/14241; B81C 3/001; B81C 2203/032
  See application file for complete search history.

(56) References Cited

U.S. PATENT DOCUMENTS

| | | |
|---|---|---|
| 2003/0025768 A1 | 2/2003 | Koike et al. |
| 2009/0207213 A1 | 8/2009 | Tsuda |
| 2014/0267491 A1 | 9/2014 | Nakao et al. |
| 2017/0006624 A1 | 1/2017 | Kim et al. |
| 2017/0066240 A1* | 3/2017 | Hirai ................. B41J 2/1646 |

FOREIGN PATENT DOCUMENTS

| | | |
|---|---|---|
| EP | 0875380 A | 11/1998 |
| JP | 2000-289197 A | 10/2000 |
| JP | 2002-292871 A | 10/2002 |
| JP | 2014-051008 A | 3/2014 |

* cited by examiner

*Primary Examiner* — Henok Legesse
(74) *Attorney, Agent, or Firm* — Workman Nydegger

(57) ABSTRACT

A MEMS device includes a first substrate and a second substrate that is disposed laminated on the first substrate and has a piezoelectric element on the first substrate side, in which the first substrate and the second substrate are substantially the same size, and in planar view, an end of the first substrate and an end of the second substrate are disposed at substantially the same position.

5 Claims, 10 Drawing Sheets

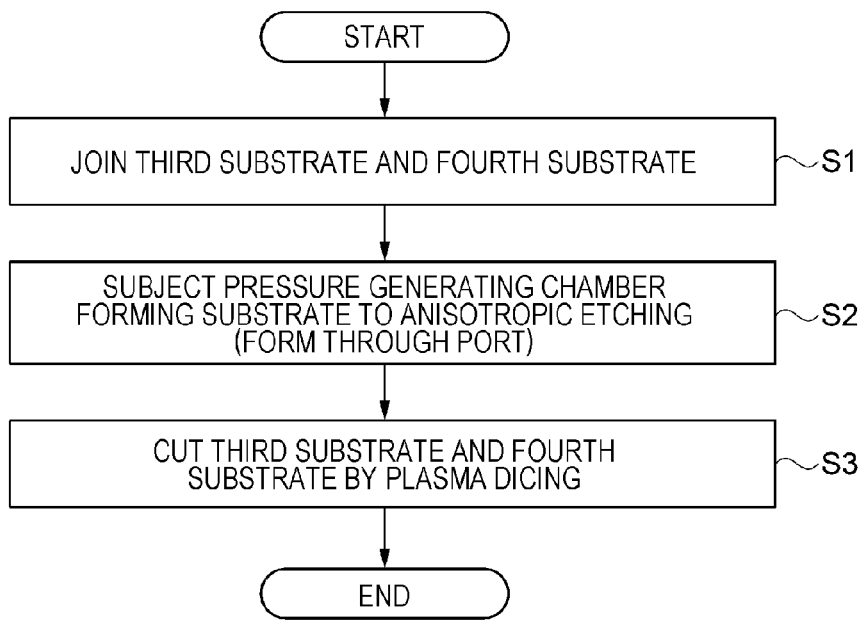
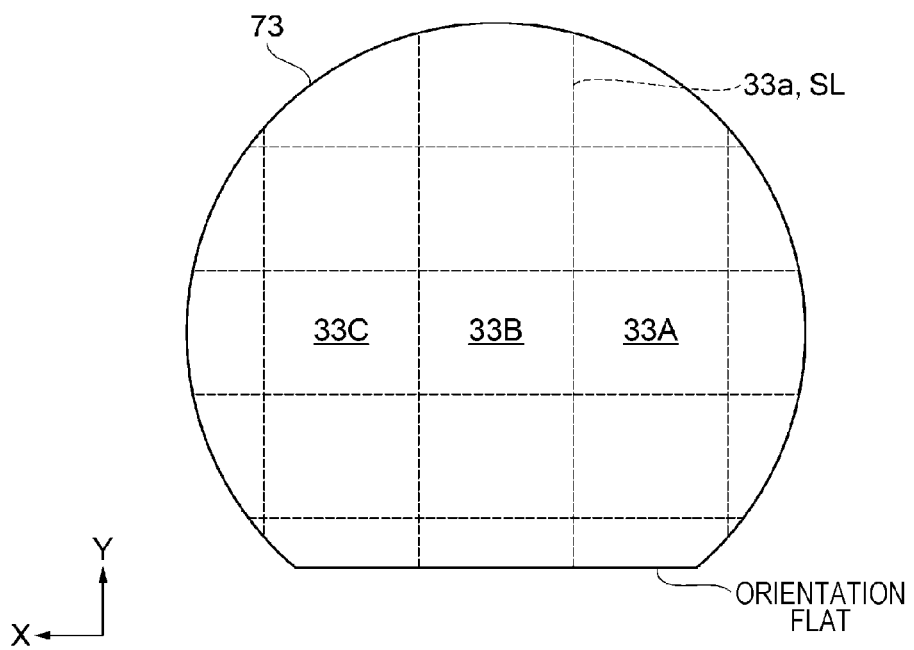

MEMS DEVICE, LIQUID EJECTING HEAD, LIQUID EJECTING APPARATUS, MANUFACTURING METHOD OF MEMS DEVICE, AND MANUFACTURING METHOD OF LIQUID EJECTING HEAD

CROSS-REFERENCE TO RELATED APPLICATIONS

The present application claims priority to Japanese Patent Application No. 2015-176371 filed on Sep. 8, 2015, which is hereby incorporated by reference in its entirety.

BACKGROUND

1. Technical Field

The present invention relates to a MEMS device, a liquid ejecting head which is an example of the MEMS device, a liquid ejecting apparatus which is provided with the liquid ejecting head, a manufacturing method of a MEMS device, and a manufacturing method of a liquid ejecting head.

2. Related Art

An ink jet recording head, which is an example of a Micro Electro Mechanical Systems (MEMS) device, has a flow path forming substrate on which a pressure generating chamber that retains liquid is formed and a functional element (piezoelectric element) that is provided on one surface side of the flow path forming substrate, generates pressure variation in the liquid within the pressure generating chamber by driving the piezoelectric element, and ejects a liquid droplet from a nozzle that is linked to the pressure generating chamber.

As such a piezoelectric element, an element is suggested with a thin-film shape that is formed by film deposition and photolithography on the flow path forming substrate. It is possible to dispose the piezoelectric elements at high density by using the thin-film shape piezoelectric elements, on the other hand, electrical connection between the piezoelectric elements that are disposed at high density and a driving circuit is difficult.

For example, an ink jet recording head described in JP-A-2014-51008 has a pressure generating chamber forming substrate which forms a pressure generating chamber, a piezoelectric actuator (piezoelectric element) which applies ejection energy to ink within the pressure generating chamber, and a substrate on which a driver that drives the piezoelectric element is formed. The pressure generating chamber forming substrate is larger than a substrate on which the driver is formed, the piezoelectric element is sealed by the pressure generating chamber forming substrate, the substrate on which the driver is formed, and an adhesive, is blocked from the atmosphere, and moisture-proofing of the piezoelectric element is achieved.

Furthermore, the piezoelectric element and the driving circuit are electrically connected via a bump. It is possible to easily electrically connect the piezoelectric element and the driving circuit even in a case where the piezoelectric elements are disposed at high density by using the bump that electrically connects the piezoelectric element and the driving circuit.

However, in a case where the pressure generating chamber forming substrate for achieving high density of nozzles that eject liquid is manufactured using a silicon single crystal substrate, and furthermore, the pressure generating chamber forming substrate for increasing ejectability and ejection precision of liquid is thinned, in the ink jet recording head described in JP-A-2014-51008, there is a problem in that mechanical damage tends to be generated on the pressure generating chamber forming substrate since the pressure generating chamber forming substrate is larger than the substrate on which the driver is formed and an end of the pressure generating chamber forming substrate overhangs from an end of the substrate on which the driver is formed.

SUMMARY

The invention can be realized in the following aspects or application examples.

Application Example 1

According to this application example, there is provided a MEMS device including a first substrate and a second substrate that is disposed laminated on the first substrate and has a functional element on the first substrate side, in which the first substrate and the second substrate are substantially the same size, and in planar view, an end of the first substrate and an end of the second substrate are disposed at substantially the same position.

According to this application example, since the first substrate and the second substrate that has the functional element are substantially the same size, and in planar view, the end of the first substrate and the end of the second substrate are disposed at substantially the same position, the second substrate is protected by the first substrate and mechanical damage to the second substrate tends not to be generated.

For example, in a case where the MEMS device is manufactured by handling in a state in which the first substrate and the second substrate are joined, since mechanical damage to the second substrate tends not to be generated, it is possible to increase manufacturing yield of the MEMS device and increase quality of the MEMS device.

Application Example 2

In the MEMS device according to the application example, it is preferable that thickness of the first substrate is thinner than the thickness of the second substrate.

When the thickness of the first substrate is thicker than the thickness of the second substrate, in comparison to a case in which the thickness of the first substrate is thicker than the thickness of the second substrate, it is possible to increase mechanical strength of the first substrate and increase resistance with respect to mechanical impact of the first substrate. It is more difficult for the mechanical damage on the second substrate to be generated due to the second substrate being protected by the first substrate on which resistance with respect to mechanical impact is increased.

Application Example 3

In the MEMS device according to the application example, it is preferable for the first substrate to include a driving circuit.

When the driving circuit is formed on the first substrate and the driving circuit is built in to the first substrate, it is possible to thin the MEMS device in comparison to a configuration in which the substrate on which the driving circuit is formed on the first substrate is externally attached (mounted).

Application Example 4

Preferably, the MEMS device according to the application example further includes an adhesive layer that joins the first substrate and the second substrate, and the adhesive layer encloses the functional element.

Since the adhesive layer that joins the first substrate and the second substrate encloses the functional element, the functional element is sealed by the first substrate, the second substrate, and the adhesive layer, the atmosphere is blocked, and moisture (humidity) infiltration from the atmosphere of the functional element is suppressed. Accordingly, deterioration of the functional element due to moisture infiltration is suppressed and it is possible to increase reliability of the MEMS device.

Application Example 5

According to this application example, there is provided a liquid ejecting head that is the MEMS device in the above described application example, in which it is preferable that the functional element in the above described application example is a piezoelectric element, and the second substrate is provided with a pressure generating chamber forming substrate that has a through port which is a pressure generating chamber that is linked to the nozzle, a vibration plate which seals an opening of the through port on the first substrate side, and a piezoelectric element that is formed on the surface of the vibration plate on the first substrate side.

In the liquid ejecting head according to this application example, pressure variation in the pressure generating chamber is generated due to driving of the piezoelectric element and ink is ejected from a nozzle by using the pressure variation. The piezoelectric element is sealed by the first substrate, the second substrate, and the adhesive layer, the atmosphere is blocked, and moisture (humidity) infiltration from the atmosphere of the functional element is suppressed. Accordingly, deterioration of the piezoelectric element due to moisture infiltration is suppressed, and the piezoelectric element stably operates and has high reliability. Accordingly, the liquid ejecting head that has the piezoelectric element also stably ejects ink from the nozzle and has high reliability.

Additionally, in the liquid ejecting head according to the application example, mechanical damage to the second substrate tends not to be generated and it is possible to increase manufacturing yield and quality of the liquid ejecting head.

Application Example 6

According to this application example, there is provided a liquid ejecting apparatus including the liquid ejecting head in the above described application example.

The liquid ejecting head according to this application example increases manufacturing yield and quality and has high reliability. Accordingly, the liquid ejecting apparatus that has the liquid ejecting head in the above described application example also increases manufacturing yield and quality and has high reliability.

Application Example 7

According to this application example, there is provided a manufacturing method of a MEMS device including a first substrate and a second substrate that is disposed laminated on the first substrate and has a functional element on the first substrate side, the method including joining a third substrate and a fourth substrate such that an adhesive layer is disposed between the third substrate on which a plurality of the first substrates are formed and the fourth substrate on which a plurality of the second substrates are formed, and in planar view, an end of the first substrate and an end of the second substrate are disposed at substantially the same position, and cutting the third substrate and the fourth substrate and dividing into individual pieces the plurality of formed first substrates and second substrates.

According to this application example, after the third substrate (mother board) on which the plurality of first substrates are formed and the fourth substrate (mother board) on which the plurality of second substrates are formed are joined by bonding such that in planar view, the end of the first substrate and the end of the second substrate are disposed at substantially the same position, the third substrate and the fourth substrate are cut and the plurality of formed first substrates and second substrates (MEMS devices) are divided into individual pieces. That is, since single MEMS devices are manufactured by cutting the mother board on which a plurality of MEMS devices are formed, it is possible to increase productivity of the MEMS device in comparison to a case in which single MEMS devices are manufactured by joining by bonding a single first substrate and a single second substrate. Furthermore, in the MEMS device that is manufactured using the manufacturing method, in planar view, the end of the first substrate and the end of the second substrate are disposed at substantially the same position.

Accordingly, in the manufacturing method of a MEMS device according to this application example, in planar view, it is possible to manufacture with high productivity the MEMS device in which the end of the first substrate and the end of the second substrate are disposed at substantially the same position.

Application Example 8

In the manufacturing method of a MEMS device according to the application example, it is preferable to cut the third substrate and the fourth substrate by plasma dicing by dicing using plasma etching in the dividing into individual pieces of the plurality of formed first substrates and second substrates.

Since the third substrate and the fourth substrate are cut by chemically etching the third substrate and the fourth substrate using plasma etching, foreign matter tends not to be generated and it is possible to suppress an adverse effect of foreign matter on the MEMS device in comparison to a case in which the third substrate and the fourth substrate are cut by mechanically shaving the third substrate and the fourth substrate using, for example, a dicing blade.

Application Example 9

According to this application example, there is provided a manufacturing method of a liquid ejecting head including a first substrate and a second substrate that is disposed laminated on the first substrate and is provided with a pressure generating chamber forming substrate that has a through port which is a pressure generating chamber that is linked to the nozzle, a vibration plate that seals an opening of the through port on the first substrate side, and a piezoelectric element that is formed on the surface of the vibration plate on the first substrate side, the method including joining a third substrate and a fourth substrate such that an adhesive layer is disposed between the third substrate on which a plurality of the first substrates are formed and the fourth substrate on which a plurality of the second substrates are formed, and in planar view, an end of the first substrate and an end of the second substrate are disposed at substantially the same position, and cutting the third substrate and the fourth substrate and dividing into individual pieces the plurality of formed first substrates and second substrates.

According to this application example, after the third substrate (mother board) on which the plurality of first substrates are formed and the fourth substrate (mother board) on which the plurality of second substrates are formed are joined by bonding such that in planar view, the end of the first substrate and the end of the second substrate are disposed at substantially the same position, the liquid ejecting head is manufactured by cutting the third substrate and the fourth substrate and dividing into individual pieces the plurality of formed first substrates and second substrates. That is, since single liquid ejecting heads are manufactured by cutting the mother board on which a plurality of liquid ejecting heads are formed, it is possible to increase productivity of the liquid ejecting head in comparison to a case in which single liquid ejecting heads are manufactured by joining by bonding single first substrates and single second substrates. Furthermore, in the liquid ejecting head that is manufactured using the manufacturing method, in planar view, the end of the first substrate and the end of the second substrate are disposed at substantially the same position.

Accordingly, in the manufacturing method of the liquid ejecting head according to this application example, in planar view, it is possible to manufacture with high productivity the liquid ejecting head in which the end of the first substrate and the end of the second substrate are disposed at substantially the same position.

Application Example 10

In the manufacturing method of a liquid ejecting head according to the application example, it is preferable to cut the third substrate and the fourth substrate by plasma dicing by dicing using plasma etching in the dividing into individual pieces of the plurality of formed first substrates and second substrates.

Since the third substrate and the fourth substrate are cut by chemically etching the third substrate and the fourth substrate using plasma etching, foreign matter tends not to be generated and it is possible to suppress an adverse effect of foreign matter on the liquid ejecting head in comparison to a case in which the third substrate and the fourth substrate are cut by mechanically shaving the third substrate and the fourth substrate using, for example, a dicing blade.

Application Example 11

Preferably, the manufacturing method of a liquid ejecting head according to the application example further includes subjecting the pressure generating chamber forming substrate to anisotropic etching, between joining the third substrate and the fourth substrate and dividing into individual pieces of the plurality of formed first substrates and second substrates, and forming the through port.

The pressure generating chamber forming substrate of the second substrate is subjected to anisotropic etching and mechanical strength of the second substrate is significantly reduced when the through port is formed in the pressure generating chamber forming substrate. For this reason, it is preferable to form the through port in the pressure generating chamber forming substrate after the second substrate is joined to the first substrate and the mechanical strength of the second substrate is increased due to the first substrate. Thereby, it is preferable to execute forming of the through port on the pressure generating chamber forming substrate after joining the third substrate and the fourth substrate.

The through ports of the respective plurality of formed second substrates being collectively formed is superior in productivity in comparison to a case in which the through ports of the second substrates divided into individual pieces are respectively formed. Thereby, it is preferable to carry out forming of the through port on the pressure generating chamber forming substrate prior to dividing into individual pieces the plurality of formed first substrates and second substrates.

Accordingly, it is preferable to carry out forming of the through port on the pressure generating chamber forming substrate between joining the third substrate and the fourth substrate and dividing into individual pieces the plurality of formed first substrates and second substrates.

BRIEF DESCRIPTION OF THE DRAWINGS

The invention will be described with reference to the accompanying drawings, wherein like numbers reference like elements.

FIG. 3 is a process flow illustrating a manufacturing method of the recording head according to Embodiment 1.

FIG. 4 is a schematic planar view of a first substrate.

DESCRIPTION OF EXEMPLARY EMBODIMENTS

Figure 1:
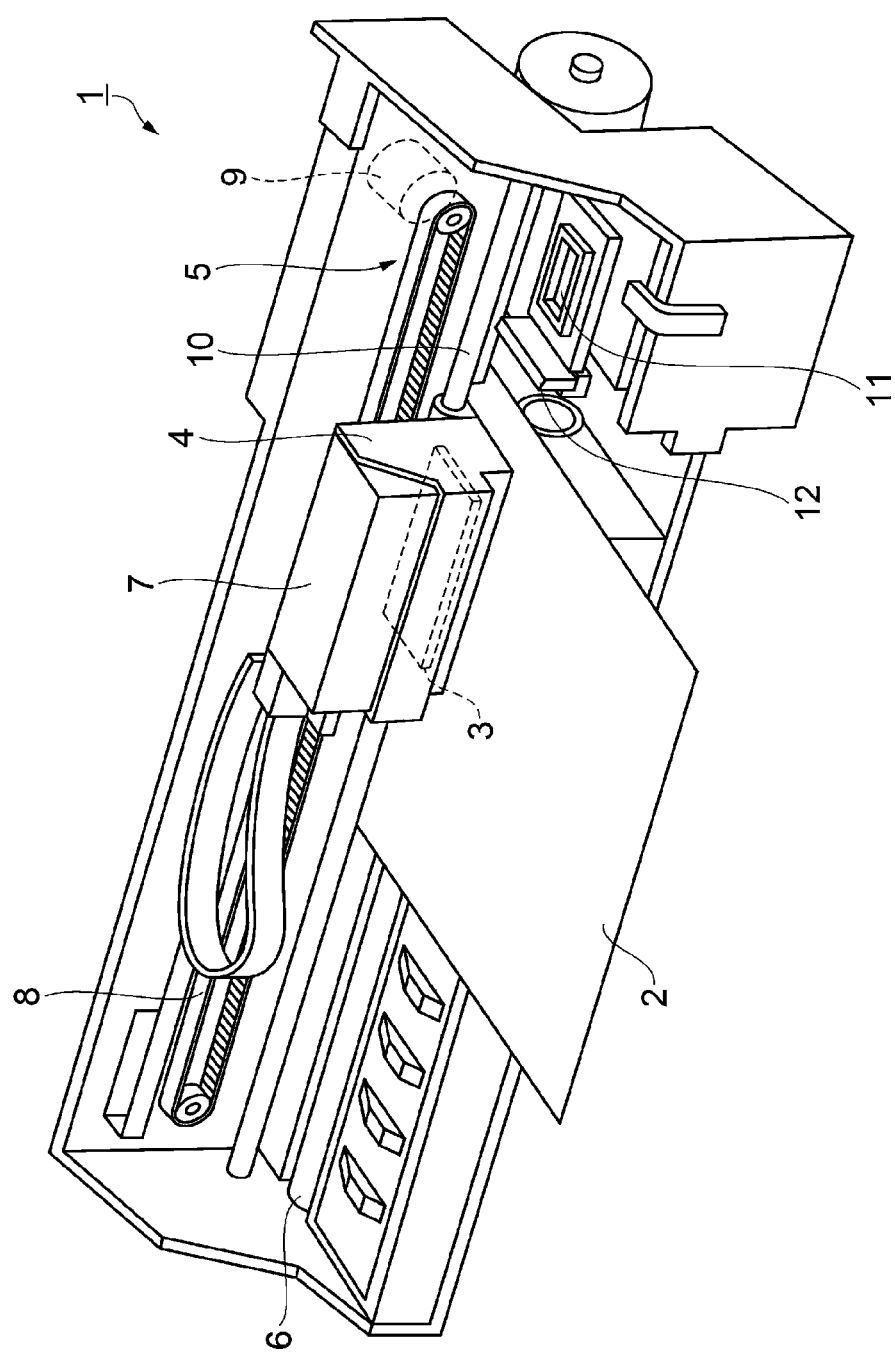
FIG. 1 is a schematic view illustrating a configuration of a printer according to Embodiment 1.

Embodiments of the invention will be described below with reference to the drawings. The present embodiment illustrates an aspect of the invention, but is not limited to the invention, and is able to be arbitrarily modified within the scope of the technical concept of the invention. In addition, in each of the drawings described below, the scale of each layer and each part is different from the actual size in order for the sizes of each layer and each part to be to the extent so as to be recognizable in the drawings.

Embodiment 1

Summary of Printer

FIG. 1 is a schematic view illustrating a configuration of an ink jet recording apparatus (hereinafter, referred to as printer) according to Embodiment 1. To begin with, with reference to FIG. 1, a summary of a printer 1 that is an example of a "liquid ejecting apparatus" will be described.

The printer 1 according to the embodiment is an apparatus that ejects ink that is an example of "liquid" on a recording medium 2 such as recording paper and performs recording (printing) of an image or the like on the recording medium 2.

As shown in FIG. 1, the printer 1 is provided with a recording head 3, a carriage 4 to which the recording head 3 is attached, a carriage moving mechanism 5 which moves the carriage 4 in a main scanning direction, a transport mechanism 6 which transfers the recording medium 2 in a sub-scanning direction, and the like. Here, the ink is retained in an ink cartridge 7 which acts as a liquid supply source. The ink cartridge 7 is mounted so as to be attachable and detachable with respect to the recording head 3.

Note that, the recording head 3 is an example of the "Micro Electro Mechanical Systems (MEMS) device" and the "liquid ejecting head". Furthermore, there may be a configuration in which the ink cartridge is disposed at a printer main body side, and ink is supplied from the ink cartridge to the recording head 3 through an ink supply tube.

The carriage moving mechanism 5 is provided with a timing belt 8 and is driven by a pulse motor 9 such as a DC motor. When the pulse motor 9 is operated, the carriage 4 is guided on a guide rod 10 which is installed in the printer 1 and reciprocally moves in the main scanning direction (width direction of the recording medium 2). The position of the carriage 4 in the main scanning direction is detected by a linear encoder (illustration omitted) that is a type of positional information detecting means. The linear encoder transmits a detection signal, that is, an encoder pulse to a control portion of the printer 1.

In addition, a home position that is a reference point of a scan of the carriage 4 is set on an end portion region further on the outside than the recording surface within a movement range of the carriage 4. A cap 11 that seals a nozzle 22 (refer to FIG. 2) that is formed on a nozzle surface (nozzle plate 21 (refer to FIG. 2)) of the recording head 3 and a wiping unit 12 that wipes the nozzle surface are disposed in order from the end section side at the home position.

Recording Head Summary

Figure 2:
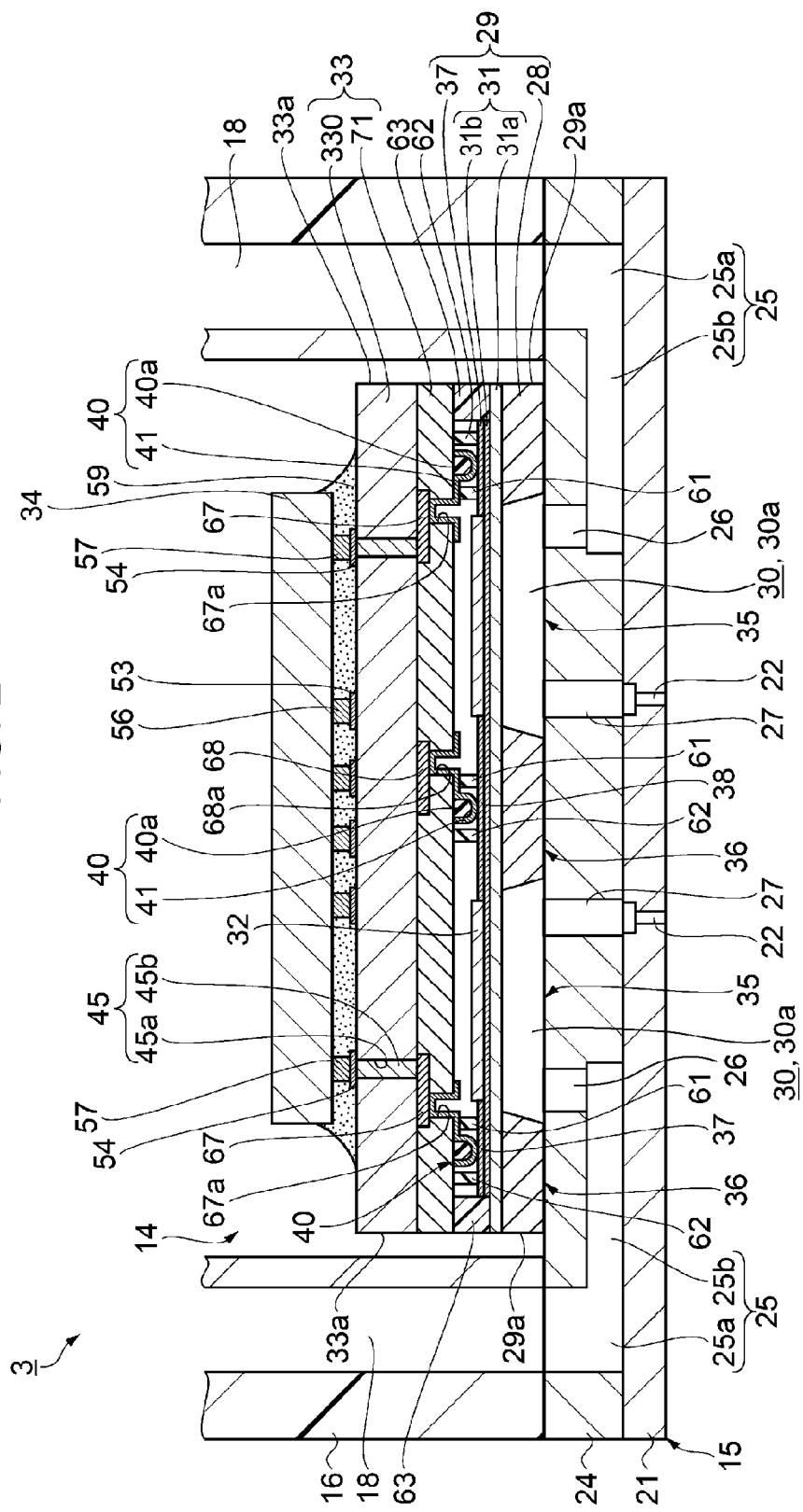
FIG. 2 is a schematic sectional view illustrating a configuration of a recording head according to Embodiment 1.

FIG. 2 is a schematic sectional view illustrating a configuration of a recording head according to the embodiment.

Next, a summary of the recording head 3 will be described with reference to FIG. 2.

As shown in FIG. 2, the recording head 3 has a flow path unit 15, an electronic device 14, and a head case 16. In the recording head 3, the head case 16 is attached in a state in which the flow path unit 15 and the electronic device 14 are laminated.

Hereafter, a direction in which the flow path unit 15 and the electronic device 14 are laminated is described as an up and down direction. Furthermore, a view from the up and down direction is referred to as "planar view". That is, "planar view" in the present application is equivalent to a view from a direction (up and down direction) in which the flow path unit 15 and the electronic device 14 are laminated.

The head case 16 is a box-shaped member made of a synthetic resin and forms a reservoir 18 that supplies ink in each pressure generating chamber 30 to the inner portion of the head case 16. The reservoir 18 is a space in which ink is retained that is common with the plurality of lined up pressure generating chambers 30, and two reservoirs 18 are formed corresponding to the row of the pressure generating chambers 30 that are lined up in two rows. Note that, an ink introduction path (illustration omitted) that introduces ink from the ink cartridge 7 side to the reservoir 18 is formed above the head case 16.

The flow path unit 15 that is joined to the lower surface of the head case 16 has a linking substrate 24 and a nozzle plate 21. The linking substrate 24 is a plate material formed of silicon, and in the embodiment, is manufactured from the silicon single crystal substrate on which a crystal face azimuth on the front surfaces (upper surface and lower surface) is set as a (110) surface. A common liquid chamber 25 in which ink is retained common to each pressure generating chamber 30 that is linked to the reservoir 18 and an individual linking path 26 that supplies ink from the reservoir 18 via the common liquid chamber 25 individually to each pressure generating chamber 30 are formed on the linking substrate 24 by etching. The common liquid chamber 25 is a long space portion along a nozzle row direction and is formed in two rows corresponding to the rows of the pressure generating chambers 30 that are lined up in two rows. The common liquid chamber 25 is configured from a first liquid chamber 25a that is passed through in a plate thickness direction of the linking substrate 24 and a second liquid chamber 25b which is recessed up to the middle of the plate thickness direction of the linking substrate 24 from the lower surface side toward the upper surface side of the linking substrate 24 and that is formed in a state in which a thin plate portion remains on the upper surface side. A plurality of individual linking paths 26 are formed in the thin plate portion of the second liquid chamber 25b along the arrangement direction of the pressure generating chamber 30 corresponding to the pressure generating chamber 30. The individual linking path 26 is linked to one end portion in the longitudinal direction of the corresponding pressure generating chamber 30 in a state in which the linking substrate 24 and the second substrate 29 are joined.

In addition, the nozzle linking path 27 that is passed through in a plate thickness direction of the linking substrate 24 is formed on the position corresponding to each nozzle 22 of the linking substrate 24. That is, a plurality of nozzle linking paths 27 are formed along the nozzle row direction corresponding to the nozzle row. The pressure generating chamber 30 and the nozzle 22 are linked by the nozzle linking path 27. The nozzle linking path 27 is linked to another end portion (end portion on the opposite side from the individual linking path 26 side) in the longitudinal direction of the corresponding pressure generating chamber 30 in a state in which the linking substrate 24 and the second substrate 29 are joined.

The nozzle plate 21 is a substrate formed of silicon (for example, a silicon single crystal substrate) that is joined to the lower surface of the linking substrate 24 (surface on the opposite side from the second substrate 29 side). In the embodiment, an opening on the lower surface side of the space that is the common liquid chamber 25 is sealed by the nozzle plate 21. In addition, a plurality of nozzles 22 are established in a straight line shape (row shape) on the nozzle plate 21. In the embodiment, the nozzle rows are formed in two rows which correspond to the rows of the pressure generating chamber 30 which are formed in two rows. The plurality of established nozzles 22 (nozzle rows) are provided at equal gaps along the sub-scanning direction which is orthogonal to the main scanning direction at a pitch (for example, 600 dpi) corresponding to the dot formation density from the nozzle 22 on one end side up to the nozzle 22 on the other end side.

Note that, the nozzle plate is joined to a region separated from the common liquid chamber to the inside in the linking substrate, and it is also possible to seal the opening on the lower surface side of the space that is the common liquid chamber using, for example, a member such as a compliance sheet that has flexibility. By doing this, the nozzle plate is able to reduce the size of the nozzle plate as much as possible.

The electronic device 14 is a piezoelectric device with a thin film shape that functions as an actuator that generates pressure variation in ink within each pressure generating chamber 30. That is, in the electronic device 14, pressure variation in ink within each pressure generating chamber 30 is generated and ink is ejected from the nozzle 22 that is linked to each pressure generating chamber 30.

The electronic device 14 has a configuration in which the second substrate 29, adhesives 61, 62, and 63, the first substrate 33, and a driving IC 34 are set in units laminated in order. In other words, in the electronic device 14, the second substrate 29 and the first substrate 33 that is provided with the driving IC 34 are joined by the adhesives 61, 62, and 63.

Note that, the adhesive 63 is an example of an "adhesive layer".

The second substrate 29 is disposed laminated on the first substrate 33. The first substrate 33 and the second substrate 29 are substantially the same size, and in planar view, the end 33a of the first substrate 33 and the end 29a of the second substrate 29 are disposed at substantially the same position, and the second substrate 29 is protected by the first substrate 33. Accordingly, in the embodiment, in planar view, mechanical damage tends not to be generated on the second substrate 29 in comparison to a case in which the end 29a of the second substrate 29 overhangs from the end 33a of the first substrate 33.

On the second substrate 29, an ink flow path is formed in the recording head 3 using the linking substrate 24 and the head case 16. If it is assumed that when the second substrate 29 is thick and the capacity of the pressure generating chamber 30 is increased, it is difficult to appropriately control pressure variation of ink within each pressure generating chamber 30 and ink tends not to be appropriately ejected from the nozzle 22. For this reason, the thickness of the second substrate 29 is thinner than the thickness of the first substrate 33. That is, the thickness of the first substrate 33 is thicker than the thickness of the second substrate 29. In detail, the thickness of the second substrate 29 is thinner than approximately 100 μm and the thickness of the first substrate 33 is thicker than approximately 300 μm.

By setting the thickness of the first substrate 33 to be thicker than the thickness of the second substrate 29, in comparison to a case in which the thickness of the first substrate 33 is thinner than the thickness of the second substrate 29, it is possible to increase mechanical strength of the first substrate 33 and increase resistance with respect to mechanical impact of the first substrate 33. Accordingly, it is more difficult for the mechanical damage on the second substrate 29 to be generated due to the second substrate 29 being protected by the first substrate 33 on which resistance with respect to mechanical impact is increased.

Although described later in detail, when the electronic device 14 (second substrate 29 and first substrate 33) in manufacturing of the recording head 3 is handled, mechanical impact is applied to the end portion of the second substrate 29, mechanical damage such as an end portion of the second substrate 29 being absent tends not to be generated, and it is possible to increase manufacturing yield of the recording head 3, and increase quality of the recording head 3.

The second substrate 29 has a pressure generating chamber forming substrate 28, a vibration plate 31, and a piezoelectric element 32 that is an example of the "functional element".

The pressure generating chamber forming substrate 28 is a hard plate material formed of silicon, and is manufactured from the silicon single crystal substrate on which a crystal face azimuth on the front surfaces (upper surface and lower surface) is set as a (110) surface. The pressure generating chamber forming substrate 28 has a through port 30a that is the pressure generating chamber 30. The through port 30a is formed by carrying out anisotropic etching on the silicon single crystal substrate of the face azimuth (110) in the plate thickness direction. The through port 30a is a space (hollow portion) which forms the pressure generating chamber 30.

The vibration plate 31 is a member with a thin film shape which has elasticity, and is formed on the upper surface (surface on the first substrate 33 side) of the pressure generating chamber forming substrate 28. The vibration plate 31 is configured by an elastic film 31a and an insulation film 31b that are laminated in order on the upper surface of the pressure generating chamber forming substrate 28.

The elastic film 31a is configured, for example, by silicon oxide that is formed by thermally oxidizing the upper surface (silicon) of the pressure generating chamber forming substrate 28, and is disposed on the entirety of the upper surface of the pressure generating chamber forming substrate 28. The insulation film 31b is configured by, for example, zirconium oxide that is formed by a sputtering method, and is disposed on the inside of the end 33a of the first substrate 33. That is, the elastic film 31a (silicon oxide) is larger than the insulation film 31b (zirconium oxide), and in planar view, overhangs from the insulation film 31b (zirconium oxide).

An opening (opening on the first substrate 33 side of the through port 30a) on the upper side of the through port 30a of the pressure generating chamber forming substrate 28 is sealed by the vibration plate 31. An opening on the lower side of the through port 30a of the pressure generating chamber forming substrate 28 is sealed by the linking substrate 24. Then, the through port 30a (hollow portion) that is sealed by the vibration plate 31 and the linking substrate 24 is the pressure generating chamber 30. The pressure generating chamber 30 is formed in two rows which correspond to the nozzle rows which are formed in two rows. The pressure generating chamber 30 is a long hollow portion (space) in a direction orthogonal to the nozzle row direction, the individual linking path 26 is linked to one end portion in the longitudinal direction, and the nozzle linking path 27 is linked to the other end portion.

A region which corresponds to the pressure generating chamber 30 in the vibration plate 31 (region in which the vibration plate 31 and the pressure generating chamber forming substrate 28 do not contact) functions as a displaced portion that is displaced by the vibration plate 31 in a direction that is far from the nozzle 22 or in a direction that is close accompanying displacement of the piezoelectric element 32. That is, a region which corresponds to the pressure generating chamber 30 in the vibration plate 31 (region in which the vibration plate 31 and the pressure generating chamber forming substrate 28 do not contact) is a driving region 35 in which displacement of the vibration plate 31 is permissible. Meanwhile, a region which is separated from the pressure generating chamber 30 in the vibration plate 31 (region in which the vibration plate 31 and the pressure generating chamber forming substrate 28 contact) is a non-driving region 36 in which displacement of the vibration plate 31 is inhibited.

In the driving region 35, the piezoelectric element 32 is formed on the surface (surface on the first substrate 33 side) on the opposite side from the pressure generating chamber forming substrate 28 of the vibration plate 31. In detail, a lower electrode layer (individual electrode), a piezoelectric body layer, and an upper electrode layer (common electrode) are laminated in that order on the surface on the first substrate 33 side of the vibration plate 31 in the driving region 35 and the piezoelectric element 32 is formed. The piezoelectric element 32 is a piezoelectric element of a so-called deflection mode, and changes shape of the vibration plate 31 by deflection. When an electric field according to a potential difference between the lower electrode layer and the upper electrode layer is applied to the piezoelectric body layer, the piezoelectric element 32 is displaced in the direction that is far from the nozzle 22 or in a direction that is close.

The lower electrode layer which configures the piezoelectric element 32 forms the individual electrode 37 that extends up to the non-driving region 36 more on the outside than the piezoelectric element 32, and is electrically connected to the corresponding bump electrode 40. The individual electrode 37 is disposed inside of the end 33a on the first substrate 33. That is, the insulation film 31b and the individual electrode 37 described above is disposed inside of the end 33a on the first substrate 33. The upper electrode layer which configures the piezoelectric element 32 forms the common electrode 38 that extends up to the non-driving region 36 between rows of the piezoelectric element 32, and is electrically connected to the corresponding bump electrode 40.

Furthermore, in the longitudinal direction of the piezoelectric element 32, the individual electrode 37 is formed further on the outside than the piezoelectric element 32, and the common electrode 38 is formed inside. In addition, in the embodiment, the common electrode 38 that extends from the piezoelectric element 32 row on one side and the common electrode 38 which extends from the piezoelectric element 32 row on the other side are electrically connected by the common wiring.

The first substrate 33 is disposed between the second substrate 29 and the driving IC 34, and is a relay substrate (wiring board) which supplies a signal of the driving IC 34 to the second substrate 29. The first substrate 33 has a base material 330 that is made from a silicon single crystal substrate and a wiring, electrode, or the like which are formed on the base material 330.

An electrode 67 which is electrically connected to the individual electrode 37 of the second substrate 29 and an electrode 68 which is electrically connected to the common electrode 38 of the second substrate 29 are formed on the lower surface of the base material 330 (surface on the second substrate 29 side). A plurality of electrodes 67 are formed along the nozzle row direction corresponding to the piezoelectric element 32.

The electrodes 67 and 68 are covered by the protective layer 71. The protective layer 71 is configured, for example, by silicon oxide, and has an opening 67a which exposes a portion of the electrode 67 and an opening 68a which exposes a portion of the electrode 68.

The bump electrode 40 is formed on the surface on the opposite side from the side which covers the electrodes 67 and 68 of the protective layer 71. The bump electrodes 40 are disposed at positions that respectively correspond to the individual electrode 37 and the common electrode 38 of the second substrate 29. The bump electrode 40 is configured by an inside resin 40a which has elasticity and a conductive film 41 which covers the inside resin 40a. As the inside resin 40a, for example, it is possible to use a resin such as a polyimide resin. For the conductive film 41 it is possible to use a laminate layer and the like in which an elemental metal, an alloy, a metal silicide, and a metal nitride are laminated. The conductive film 41 covers the inside resin 40a, and is electrically connected to the electrodes 67 and 68 via the openings 67a and 68a.

In a state in which the bump electrode 40 has elasticity and is elastically deformed (pressed state), the bump electrode 40 is electrically connected to the individual electrode 37 and the common electrode 38 of the second substrate 29. Due to the bump electrode 40 having elasticity, the bump electrode 40 and the individual electrode 37, and the bump electrode 40 and the common electrode 38 are respectively satisfactorily electrically connected in comparison to a case in which the bump electrode 40 does not have elasticity. Accordingly, the electrode 67 of the first substrate 33 is satisfactorily electrically connected to the individual electrode 37 of the second substrate 29 via the bump electrode 40 and the electrode 68 of the first substrate 33 is satisfactorily electrically connected to the common electrode 38 of the second substrate 29 via the bump electrode 40.

A plurality (four in the embodiment) of power supply lines 53 which supply power (for example, VDD1 (power source of a low voltage circuit), VDD2 (power source of a high voltage circuit), VSS1 (power source of a low voltage circuit), and VSS2 (power source of a high voltage circuit)) to the driving IC 34 are formed at the center of the upper surface of the base material 330 (surface on the driving IC 34). Each power supply line 53 extends along the nozzle row direction, that is, the longitudinal direction of the driving IC 34, and is connected to an external power source (illustration omitted) and the like via the wiring board (illustration omitted) such as a flexible cable in the end portion in the longitudinal direction. Then, a power supply bump electrode 56 of the corresponding driving IC 34 is electrically connected on the power supply line 53.

An individual connection terminal 54 is formed on the end portion (region separated outside from the region in which the power supply line 53 is formed) on the upper surface of the base material 330. The individual connection terminal 54 is electrically connected to the individual bump electrode 57 of the driving IC 34, and a signal from the driving IC 34 is input. A plurality of individual connection terminals 54 are formed along the nozzle row direction corresponding to the piezoelectric element 32. The individual connection terminal 54 is electrically connected to the electrode 67 that is formed on the lower surface of the base material 330 via the through wiring 45 that is formed inside the base material 330.

The through wiring 45 is a wiring which relays between the lower surface of the base material 330 and the upper surface of the base material 330, and is configured by a through hole 45a that passes through the base material 330 in the plate thickness direction and a conductor portion 45b that is filled inside the through hole 45a. The conductor portion 45b is configured by, for example, metal such as copper (Cu) or tungsten (W).

The driving IC 34 is an IC chip for driving the piezoelectric element 32, and is disposed laminated on the upper surface of the base material 330 (upper surface of the first substrate 33) via the adhesive 59 such as an anisotropically-conductive film (ACF). The power supply bump electrode 56 which is electrically connected to the power supply line 53 and the individual bump electrode 57 which is electrically connected to the individual connection terminal 54 are lined up in plurality along the nozzle row direction on the surface on the first substrate 33 side of the driving IC 34.

The power (voltage) is supplied from the power supply line 53 to the driving IC 34 via the power supply bump electrode 56. Then, the driving IC 34 generates a signal (driving signal or common signal) for individually driving each piezoelectric element 32. The driving signal that is generated by the driving IC 34 is supplied to the lower electrode layer of the piezoelectric element 32 via the individual bump electrode 57, the individual connection terminal 54, the through wiring 45, the electrode 67, the bump electrode 40, and the individual electrode 37. Furthermore, the common signal that is generated by the driving IC 34 is supplied to the upper electrode layer of the piezoelectric element 32 via a wiring (illustration omitted), the electrode 68, the bump electrode 40, and the common electrode 38 that are formed on the base material 330.

The adhesives 61, 62, and 63 are disposed on the non-driving region 36 between the first substrate 33 and the second substrate 29. The adhesives 61, 62, and 63 are joined to the first substrate 33 and the second substrate 29. In other words, the first substrate 33 and the second substrate 29 are joined by the adhesives 61, 62, and 63.

The adhesives 61, 62, and 63 are formed from a resin with resin that has photosensitivity and thermosetablility as the main component such as, for example, an epoxy resin, an acrylic resin, a phenol resin, a polyimide resin, a silicon resin, and a styrene resin.

The adhesives 61 and 62 are disposed close to the bump electrode 40 in a band shape along the nozzle row direction in a state of being separated from the bump electrode 40. As described above, the bump electrode 40 is electrically connected to the individual electrode 37 or the common electrode 38 in a state of being elastically deformed. The adhesives 61 and 62 are separated from the bump electrode 40 by the degree to which the bump electrode 40 is elastically deformed and not interfering with the bump electrode 40.

The adhesive 63 is disposed so as to enclose the piezoelectric element 32 in a peripheral edge portion of the first substrate 33 and the second substrate 29 and has a frame shape. The piezoelectric element 32 is sealed by the first substrate 33, the second substrate 29, and the adhesive 63, and influence of moisture (humidity) on an outer portion is suppressed. In other words, the influence of moisture on the piezoelectric element 32 is suppressed and deterioration of the piezoelectric element 32 due to moisture is suppressed by forming the adhesive 63 that encloses the piezoelectric element 32 between the first substrate 33 and the second substrate 29.

Accordingly, it is possible to increase reliability of the piezoelectric element 32. Furthermore, it is possible to increase reliability of the recording head 3 that has the piezoelectric element 32.

In this manner, in the recording head 3, ink from the ink cartridge 7 is introduced into the pressure generating chamber 30 via the ink introduction path, the reservoir 18, the common liquid chamber 25, and the individual linking path 26. Furthermore, the second substrate 29 is electrically connected to the individual electrode 37 and the common electrode 38, and is provided with the piezoelectric element 32 to which pressure variation is generated in ink within the pressure generating chamber 30. In this state, the piezoelectric element 32 is driven by supplying the driving signal from the driving IC 34 to the piezoelectric element 32 of the second substrate 29 via the wiring and electrode that is formed on the first substrate 33, and pressure variation is generated in the pressure generating chamber 30 by driving of the piezoelectric element 32. By using the pressure variation, in the recording head 3, the ink droplet is ejected from the nozzle 22 via the nozzle linking path 27.

Recording Head Manufacturing Method

Figure 5:
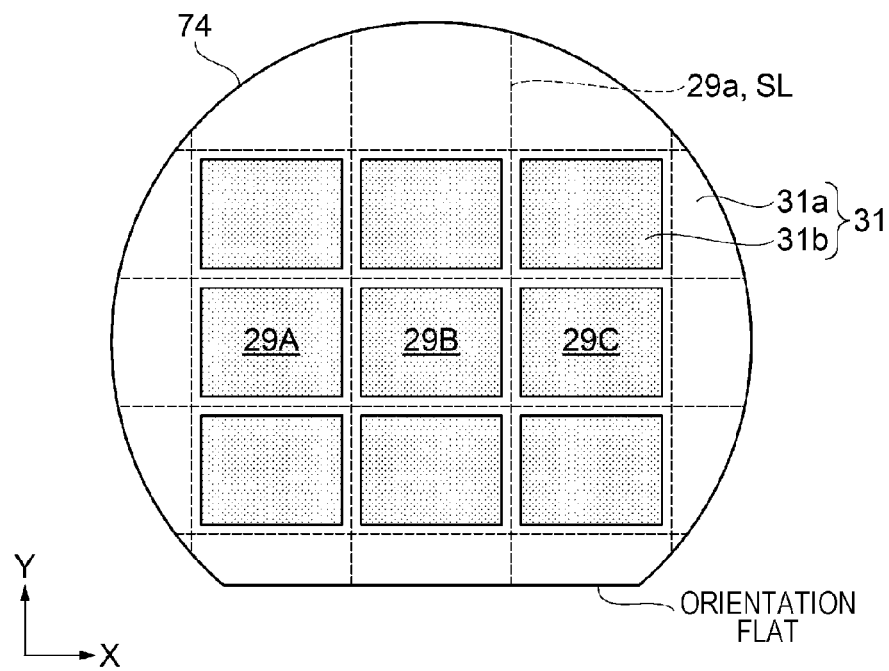
FIG. 5 is a schematic planar view of a second substrate.
Figure 6:
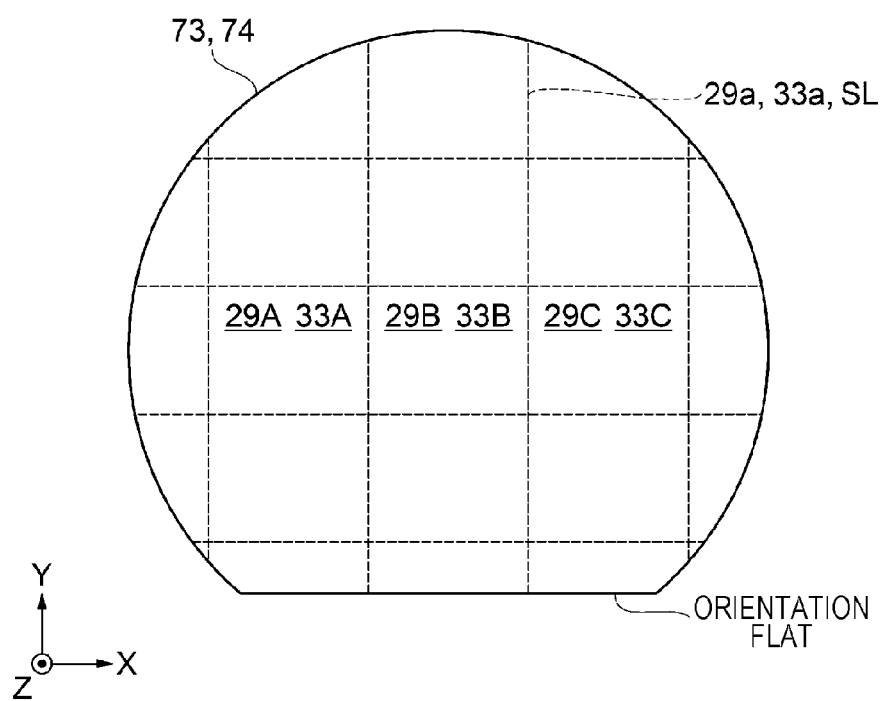
FIG. 6 is a schematic planar view illustrating a state of a substrate after step S1 is over.
Figure 7:
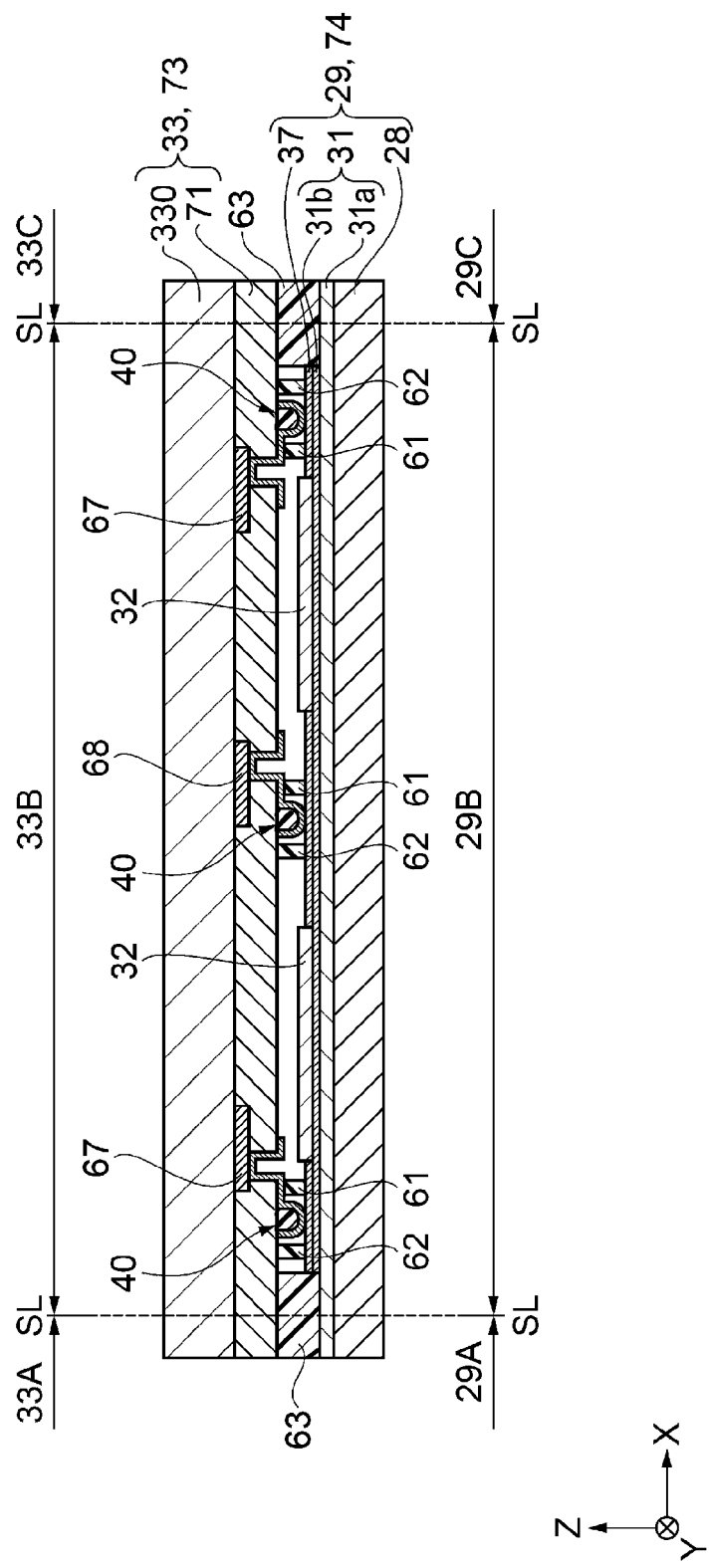
FIG. 7 is a schematic sectional view illustrating a state of a substrate after step S1 is over.
Figure 8:
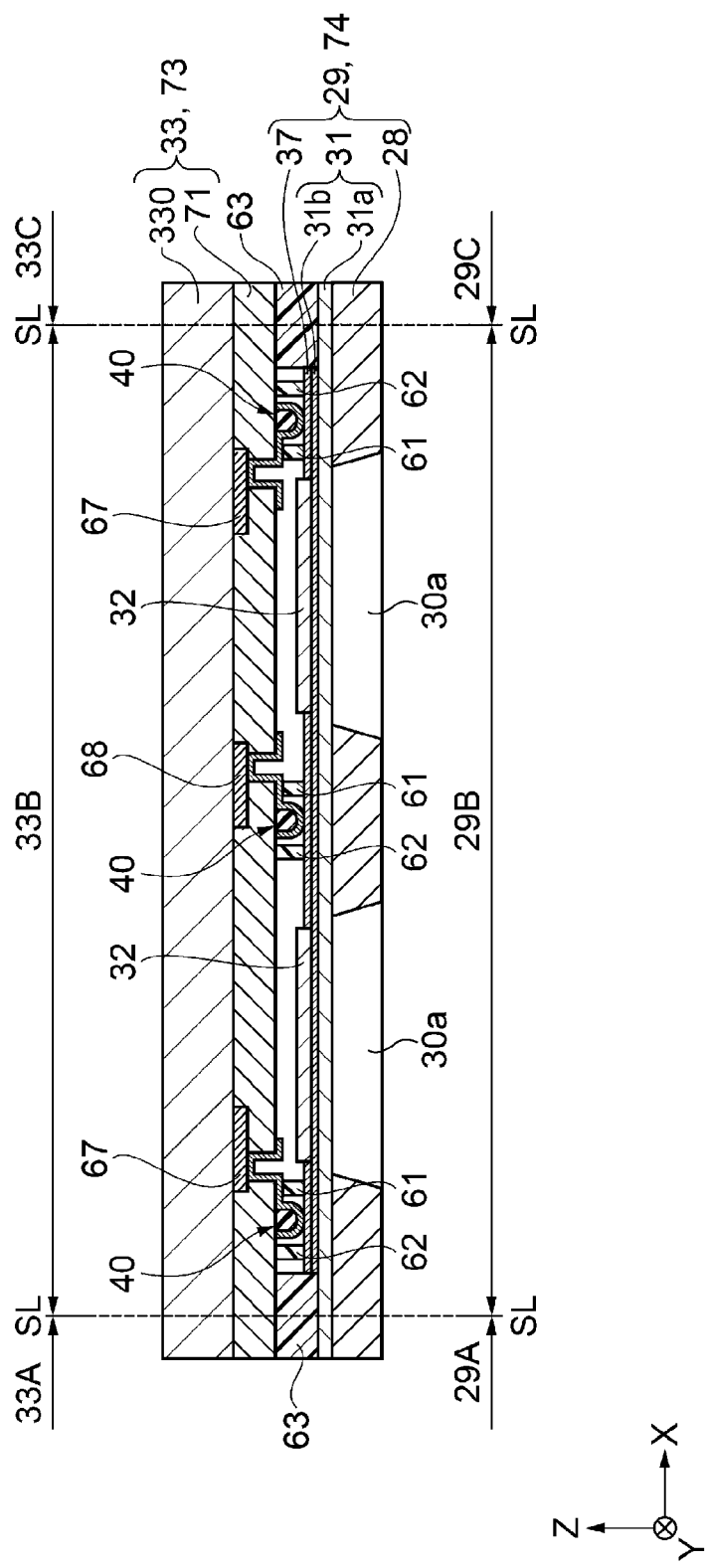
FIG. 8 is a schematic sectional view illustrating a state of a substrate after step S2 is over.
Figure 9:
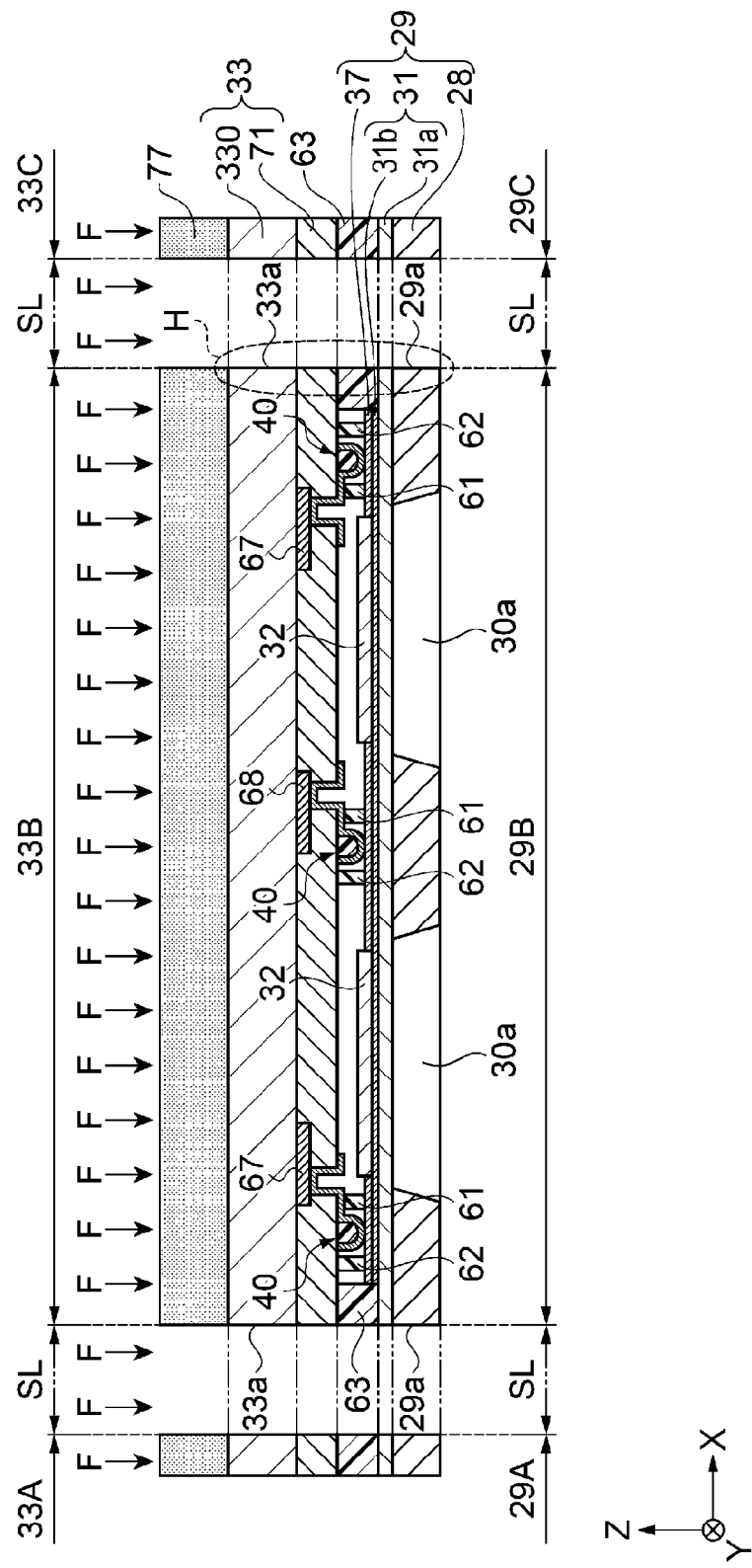
FIG. 9 is a schematic sectional view illustrating a state of a process of step S3.

FIG. 3 is a process flow illustrating a manufacturing method of the recording head according to the embodiment. FIG. 4 is a schematic planar view of the first substrate. FIG. 5 is a schematic planar view of the second substrate. FIG. 6 is a schematic planar view illustrating a state of a substrate after step S1 is over. FIG. 7 is a schematic planar view illustrating a state of the substrate after step S1 is over. FIG. 8 is a schematic planar view illustrating a state of the substrate after step S2 is over. FIG. 9 is a schematic planar view illustrating a state of a process of step S3.

Note that, FIG. 4 corresponds to a case in which the first substrate 33 is viewed in a direction from the second substrate 29 toward the first substrate 33 in FIG. 2. In FIG. 4, a contour of the first substrate 33 is indicated by a broken line. That is, the broken line in FIG. 4 is equivalent to the end 33a of the first substrate 33, and is equivalent to a cut region SL in step S3 described above. The region that is enclosed by the broken line is equivalent to a region in which the first substrate 33 is formed.

FIG. 5 corresponds to a case in which the second substrate 29 is viewed from the direction from the first substrate 33 toward the second substrate 29 in FIG. 2, that is, an opposite direction from FIG. 4. For this reason, an orientation of an arrow that indicates the X direction is opposite from FIG. 4 and FIG. 5.

Furthermore, in FIG. 5, a contour of the second substrate 29 is indicated by a broken line. That is, the broken line in FIG. 5 is equivalent to the end 29a of the second substrate 29, and is equivalent to the cut region SL in step S3 described above. The region that is enclosed by the broken line is equivalent to a region in which the second substrate 29 is formed.

In FIG. 9, the cut region SL is enlarged in order to make the state of the process of step S3 easy to understand. That is, a two-dot chain line in FIG. 9 is the enlarged cut region SL, and components of the third substrate 73 and the fourth substrate 74 that are disposed in the cut region SL are also indicated by the two-dot chain line.

The third substrate 73 (FIG. 4) and the fourth substrate 74 (FIG. 5) have a flat orientation. Hereinafter, the direction along the flat orientation is referred to as the X direction, and the direction that intersects with the X direction is referred to as a Y direction. Furthermore, there are cases in which a leading end side of an arrow which illustrates a direction is a (+) direction and a base end side of the arrow that indicates the direction refers to a (−) direction.

As shown in FIG. 4, the third substrate 73 is a silicon single crystal substrate (mother board) of the face azimuth (110) on which a plurality of first substrates 33 are formed. That is, on the third substrate 73, the plurality of first substrates 33 are formed. In FIG. 4, although illustration is omitted, the bump electrode 40, the electrodes 67 and 68, the through wiring 45, the power supply line 53, and the individual connection terminal 54 are respectively formed on the plurality of first substrates 33 (refer to FIG. 2).

Furthermore, in FIG. 4, the first substrate 33 which is disposed in the center of the third substrate 73 is referred to as a first substrate 33B, the first substrate 33 which is adjacent to the first substrate 33B on the X(−) direction side is referred to as the first substrate 33A, and the first substrate 33 which is adjacent to the first substrate 33B on the X(+) direction side is referred to as the first substrate 33C. That is, the first substrate 33A, the first substrate 33B, and the first substrate 33C are disposed in order along the X(+) direction.

As shown in FIG. 5, the fourth substrate 74 is a silicon single crystal substrate (mother board) of the face azimuth (110) on which a plurality of second substrates 29 are formed. That is, on the fourth substrate 74, the plurality of second substrates 29 are formed. Furthermore, the elastic film 31a is disposed on the entire area of the fourth substrate 74. The insulation film 31b is disposed inside the region that is enclosed by the cut region SL. That is, the elastic film 31a is disposed in the cut region SL, and the insulation film 31b is not disposed. In FIG. 5, although illustration is omitted, the piezoelectric elements 32 are respectively formed on the plurality of second substrates 29 (refer to FIG. 2). Note that, the individual electrode 37 on which the lower electrode layer of the piezoelectric element 32 is formed extending up to the non-driving region 36 is also disposed inside the region that is enclosed by the cut region SL, and is not disposed in the cut region SL in the same manner as the insulation film 31b (refer to FIG. 2).

Next, the manufacturing method of the recording head 3 according to the embodiment is described with reference to FIGS. 3, 6, and 9.

As shown in FIG. 3, the manufacturing method of the recording head 3 according to the embodiment includes a process (step S1) in which the third substrate 73 and the fourth substrate 74 are joined, a process (step S2) in which the through port 30a is formed by carrying out anisotropic etching on the pressure generating chamber forming substrate, and a process (step S3) in which the third substrate 73 and the fourth substrate 74 are cut by plasma dicing.

Note that, step S3 is an example of a "process in which a plurality of formed first substrates and second substrates are dividing into individual pieces".

In step S1, as shown in FIGS. 6 and 7, the adhesives 61, 62, and 63 are disposed between the third substrate 73 and the fourth substrate 74, and the third substrate 73 and the fourth substrate 74 are joined. In detail, the third substrate 73 on which the plurality of first substrates 33 are formed and the fourth substrate 74 on which a plurality of second substrates 29 are formed are bonded such that the adhesives 61, 62, and 63 are disposed between the third substrate 73 and the fourth substrate 74, the first substrate 33A and the second substrate 29A overlap, the first substrate 33B and the second substrate 29B overlap, and the first substrate 33C and the second substrate 29C overlap. That is, the adhesives 61, 62, and 63 are disposed between the third substrate 73 and the fourth substrate 74, and in planar view, the third substrate 73 and the fourth substrate 74 are bonded such that the end 33a of the first substrate 33 and the end 29a of the second substrate 29 overlap. Next, the third substrate 73 and the fourth substrate 74 are joined by curing the adhesives 61, 62, and 63.

Note that, in step S1, the through port 30a is not formed since the through port 30a is formed that is the pressure generating chamber 30 in the subsequent process (step S2).

In this manner, step S1 is a process in which the third substrate 73 and the fourth substrate 74 are joined such that the adhesives 61, 62, and 63 are disposed between the third substrate 73 on which a plurality of first substrates 33 are formed and the fourth substrate 74 on which a plurality of second substrates 29 are formed, and in planar view, the end 33a of the first substrate 33 and the end 29a of the second substrate 29 are disposed at approximately the same position.

Hereinafter, the direction from the third substrate 73 toward the fourth substrate 74 is referred to as a Z direction. Furthermore, there are cases in which a leading end side of an arrow which illustrates a direction is a (+) direction and a base end side of the arrow that indicates the direction refers to a (−) direction.

Note that, the Z direction is equivalent to a direction (up and down direction) in which the flow path unit 15 and the electronic device 14 described above are laminated. Accordingly, viewing from the Z direction is the same as viewing from the up and down direction, and is an example of "planar view".

In step S2, as shown in FIG. 8, anisotropic etching is carried out by, for example, KOH, and the through port 30a that is the pressure generating chamber 30 is formed on the pressure generating chamber forming substrate 28 of the fourth substrate 74 (second substrate 29). When the through port 30a is formed on the pressure generating chamber forming substrate 28, mechanical strength of the fourth substrate 74 (second substrate 29) is significantly reduced in comparison to a case in which the through port 30a is not formed on the pressure generating chamber forming substrate 28.

Even if the through port 30a is formed on the pressure generating chamber forming substrate 28 and the mechanical strength of the fourth substrate 74 is significantly reduced, a disadvantage such as mechanical damage being generated on the fourth substrate 74 is suppressed since the fourth substrate 74 is joined to the third substrate 73 in step S1 and mechanical strength of the fourth substrate 74 is increased due to the third substrate 73. Accordingly, it is preferable to carry out the process (step S2) of forming the through port 30a on the pressure generating chamber forming substrate 28 of the fourth substrate 74 (second substrate 29) after the process (step S1) of joining the third substrate 73 and the fourth substrate 74.

As shown in FIG. 9, the base material 330 (silicon), the protective layer 71 (silicon oxide), the adhesive 63 (resin (organic matter)), the elastic film 31a (silicon oxide), and the pressure generating chamber forming substrate 28 (silicon) are laminated in order along the Z(−) direction in the cut region SL.

In step S3, after the region outside of the cut region SL is covered by an etching mask 77, for example, a chemical dry etching device in which a part, in which reactive gas is excited and a plasma active species is generated, and a part, on which plasma etching is carried out, are separated, a capacitive coupling type dry etching device in which the part, in which reactive gas is excited and the plasma active species is generated, and the part, on which plasma etching is carried out, are provided at the same location, and the like are used, a fluorine gas (F gas) is used as the reactive gas, and the plasma active species (for example, F radical) that reacts with silicon, silicon oxide, resin (organic matter), or the like is generated.

Then, the F radical that is indicated by an arrow in the drawings is irradiated from the first substrate 33 side, and components of the third substrate 73 and the fourth substrate 74 which are disposed in the cut region SL are removed by carrying out etching. In detail, the base material 330 (silicon), the protective layer 71 (silicon oxide), the adhesive 63 (resin), the elastic film 31a (silicon oxide), and the pressure generating chamber forming substrate 28 (silicon) which are disposed in the cut region SL are removed in order by carrying out etching.

Note that, since the components (insulation film 31b (zirconium oxide), and individual electrode 37 (metal)) of the third substrate 73 and the fourth substrate 74 which are difficult to etch using the F radical are not disposed in the cut region SL, it is possible to smoothly remove by carrying out etching the components (base material 330, protective layer 71, adhesive 63, elastic film 31a, and pressure generating chamber forming substrate 28) of the third substrate 73 and the fourth substrate 74 that are disposed in the cut region SL using the F radical.

The components (first substrate 33 and second substrate 29) of the third substrate 73 and the fourth substrate 74 that are disposed in a region outside of the cut region SL are covered by the etching mask 77 and therefore are not etched using the F radical. Accordingly, it is possible to divide into individual pieces the plurality of formed first substrates 33 and second substrates 29 into single first substrates 33 and second substrates 29 by step S3.

Note that, as the etching mask 77, it is possible to use the insulation film, metal, or the like that tend not to be etched by the F radical.

In this manner, step S3 is a process in which the third substrate 73 and the fourth substrate 74 are cut by plasma dicing in which dicing is carried out using plasma etching, and the plurality of formed first substrates 33 and second substrates 29 are divided into individual pieces.

In step S3, since the third substrate 73 and the fourth substrate 74 of the cut region SL are etched, and the plurality of formed first substrates 33 and second substrates 29 are divided into individual pieces using the same etching mask 77, the first substrate 33 and the second substrate 29 are substantially the same size, and in planar view, the end 33a of the first substrate 33 and the end 29a of the second substrate 29 are disposed at substantially the same position.

Note that, after the plurality of formed first substrates 33 and second substrates 29 are divided into individual pieces, there is also a possibility that the through ports 30a are respectively formed on the second substrates 29. In comparison to a case where the through ports 30a are respectively formed after the plurality of formed first substrates 33 and second substrates 29 are divided into individual pieces, since collectively forming the through port 30a in the plurality of formed second substrates 29 is superior in productivity, it is preferable to carry out the process (step S2) in which the through port 30a is formed in the pressure generating chamber forming substrate 28 prior to the process (step S3) in which the plurality of formed first substrates 33 and second substrates 29 are divided into individual pieces.

Accordingly, it is preferable to carry out the process (step S2) of forming the through port 30a on the pressure generating chamber forming substrate 28 between the process (step S1) of joining the third substrate 73 and the fourth substrate 74 and the process (step S3) of dividing into individual pieces the plurality of formed first substrates 33 and the second substrates 29.

Next, after the plurality of formed first substrates 33 and second substrates 29 are divided into individual pieces, the electronic device 14 is manufactured by joining the driving IC 34 via the adhesive 59 on the surface on the opposite side from the second substrate 29 side of the first substrate 33.

Furthermore, the recording head 3 is manufactured by joining the electronic device 14, the flow path unit 15, and the head case 16.

Since the first substrate 33 and the second substrate 29 are substantially the same size, in planar view, the end 33a of the first substrate 33 and the end 29a of the second substrate 29 are disposed at substantially the same position, and the second substrate 29 is protected by the first substrate 33, when for example, the electronic device 14 is handled and the recording head 3 is manufactured by joining the electronic device 14, the flow path unit 15, and the head case 16, mechanical damage to the second substrate 29 tends not to be generated and it is possible to increase manufacturing yield and quality of the recording head 3.

First Substrate End and Second Substrate End State

FIGS. 10A to 10F are schematic sectional views of the region H that is enclosed by a broken line in FIG. 9. That is, FIGS. 10A to 10F are schematic sectional views illustrating a state of the end 33a of the first substrate 33 and the end 29a of the second substrate 29.

Note that, in FIGS. 10A to 10F, illustration of the components (base material 330 and protective layer 71) of the end 33a of the first substrate 33 is omitted, and illustration of the components (elastic film 31a and pressure generating chamber forming substrate 28) of the end 29a of the second substrate 29 is omitted.

The state of the end 33a of the first substrate 33 and the end 29a of the second substrate 29 after step S3 ends will be described below with reference to FIGS. 10A to 10F.

Figure 10A:
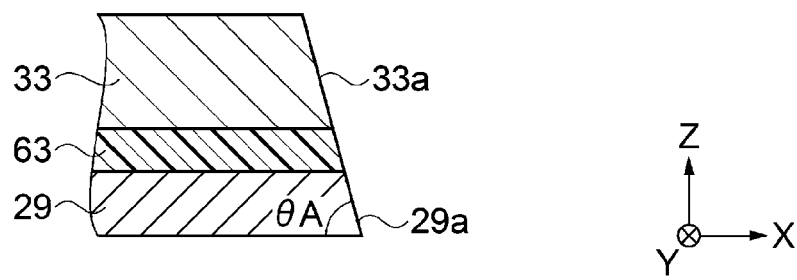
FIG. 10A is a schematic sectional view of a region H that is enclosed by a broken line in FIG. 9.

As shown in FIG. 10A, the end 33a of the first substrate 33 and the end 29a of the second substrate 29 are horizontal planes that are inclined by an angle (tapered angle) θA that is in the X direction. The tapered angle θA is smaller than a right angle, and the end 33a of the first substrate 33 and the end 29a of the second substrate 29 are horizontal planes that are inclined in a normal taper.

In this case, the end 33a of the first substrate 33 is disposed on the X(−) direction side with respect to the end 29a of the second substrate 29.

Figure 10B:
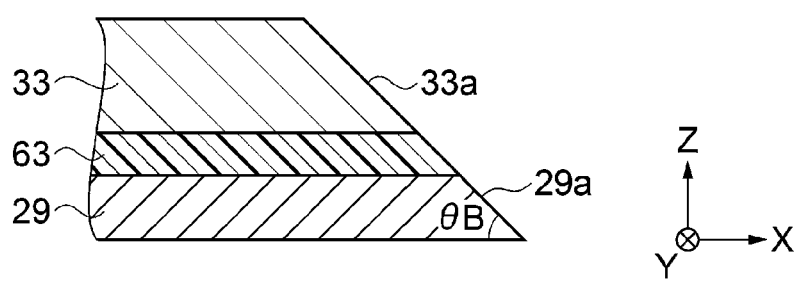
FIG. 10B is a schematic sectional view of the region H that is enclosed by a broken line in FIG. 9.

As shown in FIG. 10B, in the end 33a of the first substrate 33 and the end 29a of the second substrate 29, a tapered angle θB is smaller than the tapered angle θA, and the ends are horizontal planes that gently slope in comparison to FIG. 10A.

In this case, the end 33a of the first substrate 33 is disposed on the X(−) direction side with respect to the end 29a of the second substrate 29.

Note that, the end 33a of the first substrate 33 and the end 29a of the second substrate 29 are horizontal planes that are inclined at a right angle with respect to the X direction, and there may be a configuration in which the end 33a of the first substrate 33 and the end 29a of the second substrate 29 are disposed at the same position with respect to the X direction.

Figure 10C:
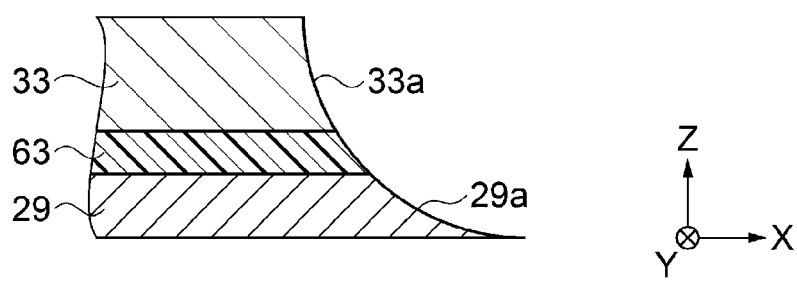
FIG. 10C is a schematic sectional view of the region H that is enclosed by a broken line in FIG. 9.

As shown in FIG. 10C, the end 33a of the first substrate 33 and the end 29a of the second substrate 29 are concave curved surfaces in which the tapered angle becomes gradually smaller along the Z(−) direction.

In this case, the end 33a of the first substrate 33 is disposed on the X(−) direction side with respect to the end 29a of the second substrate 29.

Note that, although illustration is omitted, the end 33a of the first substrate 33 and the end 29a of the second substrate 29 are convex curved surfaces in which the tapered angle becomes gradually larger along the Z(−) direction. Furthermore, the end 33a of the first substrate 33 and the end 29a of the second substrate 29 may include a horizontal plane and a curved surface.

Figure 10D:
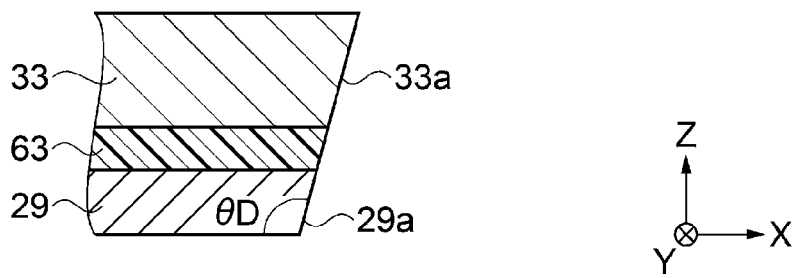
FIG. 10D is a schematic sectional view of the region H that is enclosed by a broken line in FIG. 9.

As shown in FIG. 10D, in the end 33a of the first substrate 33 and the end 29a of the second substrate 29, a tapered angle θD is larger than the right angle, and the ends are horizontal planes that are inclined with a reverse taper.

In this case, the end 33a of the first substrate 33 is disposed on the X(+) direction side with respect to the end 29a of the second substrate 29.

Figure 10E:
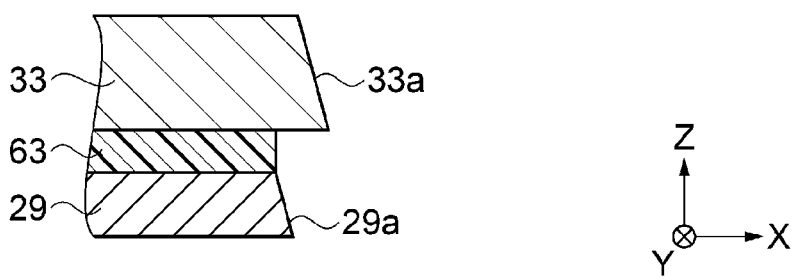
FIG. 10E is a schematic sectional view of the region H that is enclosed by a broken line in FIG. 9.

As shown in FIG. 10E, in the end 33a of the first substrate 33 and the end 29a of the second substrate 29, the tapered angle is smaller than the right angle, and the ends are horizontal planes that are inclined with a normal taper. Furthermore, the end of the adhesive 63 is disposed inside the end 33a of the first substrate 33, and an overhang is formed in which the end 33a of the first substrate 33 overhangs from the end of the adhesive 63.

In this manner, the overhang is formed by making an etching rate of the adhesive 63 with respect to the F radical faster than the etching rate of the first substrate 33 with respect to the F radical.

Figure 10F:
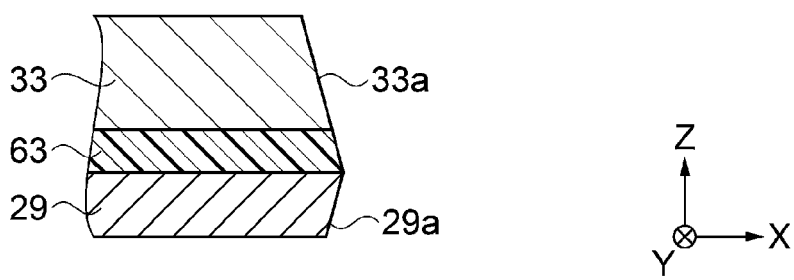
FIG. 10F is a schematic sectional view of the region H that is enclosed by a broken line in FIG. 9.

As shown in FIG. 10F, the end 33a of the first substrate 33 is a horizontal plane that is inclined with a normal taper, and the end 29a of the second substrate 29 is a horizontal plane that is inclined with a reverse taper.

The end 33a of the first substrate 33 and the end 29a of the second substrate 29 that is indicated in FIGS. 10A to 10F is able to be formed by adjusting the dry etching device (plasma etching device) that is used in step S3 or dry etching conditions. Furthermore, by modifying the dry etching device or dry etching conditions, a shape of the end 33a of the first substrate 33 and the end 29a of the second substrate 29 is changed and it is possible to form the end 33a of the first substrate 33 and the end 29a of the second substrate 29 of various shapes other than the shapes that are indicated in FIGS. 10A to 10F.

The end 33a of the first substrate 33 and the end 29a of the second substrate 29 that are indicated in FIGS. 10A to 10F are examples of "in planar view, the end of the first substrate and the end of the second substrate are disposed at substantially the same position" in the present application, and are included in the technical scope of the present application. Furthermore, the end 33a of the first substrate 33 and the end 29a of the second substrate 29 which is formed by modifying the dry etching device or dry etching conditions, that is, the end 33a of the first substrate 33 and the end 29a of the second substrate 29 of the various shapes other than the shapes that are indicated in FIGS. 10A to 10F are also examples of "in planar view, the end of the first substrate and the end of the second substrate are disposed at substantially the same position" in the present application, and are included in the technical scope of the present application.

That is, the end 33a of the first substrate 33 and the end 29a of the second substrate 29 that are formed divided into individual pieces by plasma dicing in which dicing is carried out using plasma etching are examples of "in planar view, the end of the first substrate and the end of the second substrate are disposed at substantially the same position" in the present application, and are included in the technical scope of the entire present application. Furthermore, the first substrate 33 and the second substrate 29 that are formed divided into individual pieces by plasma dicing in which dicing is carried out using plasma etching are examples of "the first substrate and the second substrate are substantially the same size" in the present application, and are included in the technical scope of the entire present application.

Furthermore, a method in which the plurality of formed first substrates 33 and the second substrates 29 are divided into individual pieces is not limited to a method in which plasma dicing described above is carried out, for example, may be a method in which dicing is carried out using the dicing blade, for example, may be a method in which dicing is carried out by irradiating laser light on the cut region SL, and for example, may be a method in which dicing is carried out using a cutter wheel.

Furthermore, the direction which irradiates the F radical may be a direction that is an opposite direction from FIG. 9 described above, that is, a direction from the second substrate 29 toward the first substrate 33. In this case, a positional relationship in the Z direction between the end 33a of the first substrate 33 and the end 29a of the second substrate 29 is opposite from the state that is indicated in FIGS. 10A to 10F.

For example, in FIGS. 10A to 10C, the end 33a of the first substrate 33 is disposed on the X(−) direction side with respect to the end 29a of the second substrate 29, but the end 33a of the first substrate 33 is disposed on the X(+) direction side with respect to the end 29a of the second substrate 29 by irradiating the F radical in a direction from the second substrate 29 toward the first substrate 33. For example, in FIG. 10D, the end 33a of the first substrate 33 is disposed on the X(+) direction side with respect to the end 29a of the second substrate 29, but the end 33a of the first substrate 33 is disposed on the X(−) direction side with respect to the end 29a of the second substrate 29 by irradiating the F radical in a direction from the second substrate 29 toward the first substrate 33.

The first substrate 33 and the second substrate 29 that are formed according to the method are examples of "the first substrate and the second substrate are substantially the same size" in the entire present application, and are included in the technical scope of the entire present application. The end 33a of the first substrate 33 and the end 29a of the second substrate 29 that are formed according to the method are examples of "in planar view, the end of the first substrate and the end of the second substrate are disposed at substantially the same position" in the entire present application, and are included in the technical scope of the entire present application.

In addition, in a method of carrying out plasma dicing in which dicing is carried out using plasma etching foreign matter tends not to be generated and it is possible to suppress defects due to foreign matter in comparison to a method in which dicing is carried using the dicing plate, a method in which dicing is carried using laser light, and a method in which dicing is carried using a cutter wheel. Accordingly, a method in which the third substrate 73 and the fourth substrate 74 are cut and the plurality of formed first substrates 33 and second substrates 29 are divided into individual pieces is preferably a method in which plasma dicing is carried out in which dicing is carried out using plasma etching.

Embodiment 2

Figure 11:
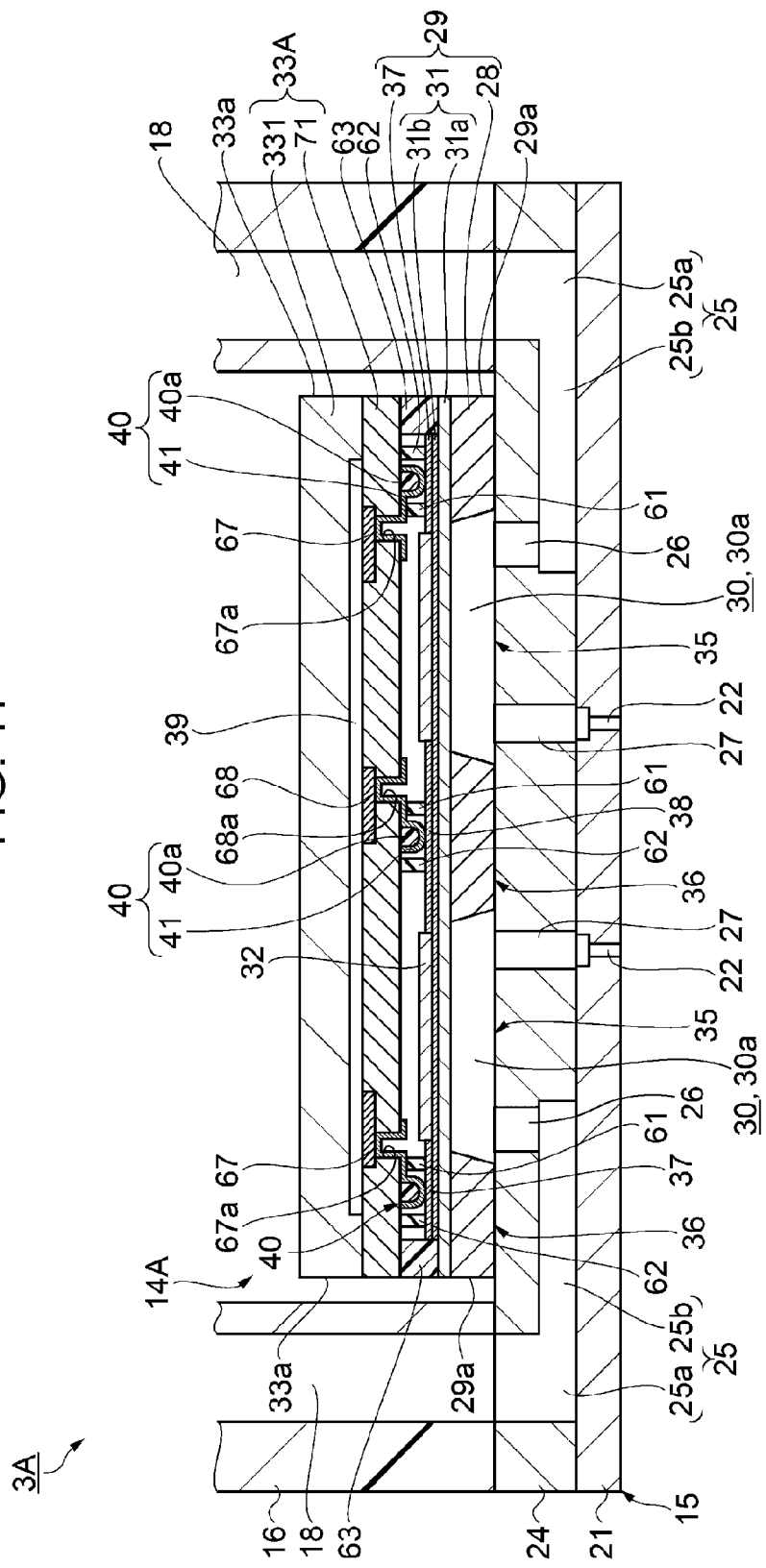
FIG. 11 is a schematic sectional view illustrating a configuration of a recording head according to Embodiment 2.

FIG. 11 is a diagram that corresponds to FIG. 2, and is a schematic sectional view illustrating a configuration of a recording head according to Embodiment 2.

In a recording head 3A according to the embodiment, a driving circuit 39 is formed which drives the piezoelectric element 32 on the first substrate 33A. In the recording head 3 according to Embodiment 1, a driving circuit is formed which drives the piezoelectric element 32 on a separate substrate (driving IC 34) from the first substrate 33. In this point, the recording head 3A according to the embodiment and the recording head 3 according to Embodiment 1 are different, and the other configuration is the same in the embodiment and Embodiment 1.

A summary of the recording head 3A according to the embodiment will be described below focusing on differences from Embodiment 1 with reference to FIG. 11. In addition, the same reference numerals are given for the configuration parts which are the same as in Embodiment 1, and overlapping description is omitted.

As shown in FIG. 11, the recording head 3A has the flow path unit 15, an electronic device 14A, and the head case 16.

The electronic device 14A is a MEMS device with a thin film shape that functions as an actuator that generates pressure variation in ink within each pressure generating chamber 30. That is, in the electronic device 14A, pressure variation in ink within each pressure generating chamber 30 is generated and ink is ejected from the nozzle 22 that is linked to each pressure generating chamber 30. The electronic device 14A has a configuration in which the second substrate 29, the adhesives 61, 62, and 63, and the first substrate 33A are set in units laminated in order.

The second substrate 29 is disposed laminated on the first substrate 33A, and has the pressure generating chamber forming substrate 28, the vibration plate 31, and the piezoelectric element 32.

The first substrate 33A is disposed laminated on the second substrate 29, and has a substrate 331 on which the driving circuit 39 is formed that drives the piezoelectric element 32, an electrode (electrode 67, electrode 68, and bump electrode 40) for supplying the signal from the driving circuit 39 to the second substrate 29, and the like.

The substrate 331, for example, is a semiconductor circuit board on which the driving circuit 39 on a p-type silicon substrate (p-type semiconductor substrate) is formed.

In detail, an N channel transistor is formed by laminating an insulation layer, an electrode layer, or the like in the p-type semiconductor region of the substrate 331. Furthermore, an n-type semiconductor region is formed by carrying out ion implantation of n-type impurities in the p-type semiconductor region of the substrate 331, and a P channel transistor is formed by laminating the insulation layer, the electrode layer, or the like in the n-type semiconductor region. Then, the driving circuit 39 is formed on the substrate 331 by a CMOS transistor that is made from the N channel transistor and the P channel transistor.

An external power source (illustration omitted) and the like is connected to the first substrate 33A via a wiring board (illustration omitted) such as a flexible cable and power (voltage) is supplied to the driving circuit 39. Then, the driving circuit 39 generates a signal (driving signal or common signal) for individually driving each piezoelectric element 32. The driving signal that is generated by the driving circuit 39 is supplied to the lower electrode layer of the piezoelectric element 32 via the electrode 67, the bump electrode 40, and the individual electrode 37. The common signal that is generated by the driving circuit 39 is supplied to the upper electrode layer of the piezoelectric element 32 via the electrode 68, the bump electrode 40, and the common electrode 38.

The adhesives 61, 62, and 63 are joined to the first substrate 33A and the second substrate 29. In other words, the first substrate 33A and the second substrate 29 are joined by the adhesives 61, 62, and 63.

In the recording head 3A according to the embodiment, since the first substrate 33A and the second substrate 29 are substantially the same size, in planar view, the end 33a of the first substrate 33A and the end 29a of the second substrate 29 are disposed at substantially the same position, and the second substrate 29 is protected by the first substrate 33A, when for example, the electronic device 14A is handled and the recording head 3A is manufactured by joining the electronic device 14A, the flow path unit 15, and the head case 16, it is possible to obtain the same effects as Embodiment 1 in that mechanical damage to the second substrate 29 tends not to be generated and it is possible to increase manufacturing yield and quality of the recording head 3A.

Furthermore, in the recording head 3A according to the embodiment, since the driving circuit 39 that drives the piezoelectric element 32 is built in to the first substrate 33A, it is possible to thin the recording head 3A in comparison to a configuration (configuration of Embodiment 1) in which a driving circuit which drives the piezoelectric element 32 is formed on a separate substrate (driving IC 34) from the first substrate 33A.

Furthermore, the invention widely targets a general head, and it is possible to apply the invention, for example, to a recording head such as various ink jet recording heads which are used in an image recording apparatus such as a printer, a color material ejecting head which is used in manufacture of color filters such as a liquid crystal display, an electrode material ejecting head which is used in electrode formation such as an organic EL display or a field emission display (FED), and a biological substance ejecting head which is used in the manufacture of bio chips, and such are included in the technical scope of the invention.

In addition, the invention widely targets a MEMS device, and it is also possible to apply the invention to a MEMS device other than the recording heads 3 and 3A described above. For example, a surface acoustic wave (SAW) device, an ultrasonic device, a motor, a pressure sensor, a pyroelectric element, and a ferroelectric element are examples of the MEMS device, it is possible to apply the invention thereto, and such are included in the technical scope of the invention.

In addition, a finished body that uses the MEMS devices, for example, a liquid ejecting apparatus that uses the recording heads 3 and 3A, a SAW oscillator that uses the SAW device, an ultrasonic sensor that uses the ultrasonic device, a robot that uses the motor as a driving source, an IR sensor that uses the pyroelectric element, a ferroelectric memory that uses the ferroelectric element, and the like are able to be applied to the invention, and such are included in the technical scope of the invention.

What is claimed is:

1. A manufacturing method of a MEMS device which includes a first substrate and a second substrate that is disposed laminated on the first substrate and has a functional element on the first substrate side, the method comprising:

joining a third substrate and a fourth substrate such that an adhesive layer is disposed between the third substrate on which a plurality of the first substrates are formed and the fourth substrate on which a plurality of the second substrates are formed, and in planar view, an end of the first substrate and an end of the second substrate are disposed at substantially the same position; and cutting the third substrate and the fourth substrate and dividing into individual pieces the plurality of formed first substrates and second substrates.

2. The manufacturing method of a MEMS device according to claim 1, wherein the third substrate and the fourth substrate are cut by plasma dicing by dicing using plasma etching in the dividing into individual pieces of the plurality of formed first substrates and second substrates.

3. A manufacturing method of a liquid ejecting head which includes a first substrate and a second substrate that is disposed laminated on the first substrate and is provided with a pressure generating chamber forming substrate that has a through port which is a pressure generating chamber that is linked to the nozzle, a vibration plate that seals an opening of the through port on the first substrate side, and a piezoelectric element that is formed on the surface of the vibration plate on the first substrate side, the method comprising:

joining a third substrate and a fourth substrate such that an adhesive layer is disposed between the third substrate on which a plurality of the first substrates are formed and the fourth substrate on which a plurality of the second substrates are formed, and in planar view, an end of the first substrate and an end of the second substrate are disposed at substantially the same position; and cutting the third substrate and the fourth substrate and dividing into individual pieces the plurality of formed first substrates and second substrates.

4. The manufacturing method of a liquid ejecting head according to claim 3, wherein the third substrate and the fourth substrate are cut by plasma dicing by dicing using plasma etching in the dividing into individual pieces of the plurality of formed first substrates and second substrates.

5. The manufacturing method of a liquid ejecting head according to claim 3, further comprising:

subjecting the pressure generating chamber forming substrate to anisotropic etching, between joining the third substrate and the fourth substrate and dividing into individual pieces of the plurality of formed first substrates and second substrates; and forming the through port.

* * * * *